(12) United States Patent
Uzoh et al.

(10) Patent No.: US 10,535,564 B2
(45) Date of Patent: Jan. 14, 2020

(54) STRUCTURES AND METHODS FOR RELIABLE PACKAGES

(71) Applicant: Invensas Corporation, San Jose, CA (US)

(72) Inventors: Cyprian Emeka Uzoh, San Jose, CA (US); Guilian Gao, San Jose, CA (US); Liang Wang, Milpitas, CA (US); Hong Shen, Palo Alto, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/649,457

(22) Filed: Jul. 13, 2017

(65) Prior Publication Data

US 2017/0309518 A1    Oct. 26, 2017

Related U.S. Application Data

(62) Division of application No. 14/749,529, filed on Jun. 24, 2015, now Pat. No. 9,741,620.

(51) Int. Cl.
*H01L 21/82*    (2006.01)
*H01L 23/31*    (2006.01)
(Continued)

(52) U.S. Cl.
CPC ............ *H01L 21/82* (2013.01); *H01L 21/486* (2013.01); *H01L 21/561* (2013.01); *H01L 23/5389* (2013.01); *H01L 23/562* (2013.01); *H01L 24/96* (2013.01); *H01L 24/97* (2013.01); *H01L 24/98* (2013.01); *H01L 23/3128* (2013.01); *H01L 2924/157* (2013.01); *H01L 2924/15311* (2013.01); *H01L 2924/15313* (2013.01); *H01L 2924/15788* (2013.01); *H01L 2924/3511* (2013.01); *H01L 2924/3512* (2013.01)

(58) Field of Classification Search
CPC ......... H01L 21/82; H01L 21/48; H01L 21/56; H01L 23/53; H01L 23/56; H01L 24/96; H01L 24/97; H01L 24/98
USPC .......................................................... 257/506
See application file for complete search history.

(56) References Cited

U.S. PATENT DOCUMENTS

| 4,467,342 A | 8/1984 | Tower |
| 5,399,898 A | 3/1995 | Rostoker |

(Continued)

FOREIGN PATENT DOCUMENTS

| EP | 0 065 425 A2 | 11/1982 |
| JP | H11-135675 A2 | 5/1999 |

(Continued)

OTHER PUBLICATIONS

European Patent Office, Patent Abstracts of Japan for H11-135675, 1999 (1 page).

(Continued)

*Primary Examiner* — Sheikh Maruf

(57) ABSTRACT

A device and method of forming the device that includes cavities formed in a substrate of a substrate device, the substrate device also including conductive vias formed in the substrate. Chip devices, wafers, and other substrate devices can be mounted to the substrate device. Encapsulation layers and materials may be formed over the substrate device in order to fill the cavities.

20 Claims, 9 Drawing Sheets

(51) Int. Cl.
  *H01L 21/56* (2006.01)
  *H01L 23/00* (2006.01)
  *H01L 21/48* (2006.01)
  *H01L 23/538* (2006.01)

(56) References Cited

U.S. PATENT DOCUMENTS

| | | |
|---|---|---|
| 6,322,903 B1 | 11/2001 | Siniaguine et al. |
| 6,437,434 B1 | 8/2002 | Sugizaki |
| 6,448,153 B2 | 9/2002 | Siniaguine et al. |
| 6,958,285 B2 | 10/2005 | Siniaguine |
| 6,964,915 B2 | 11/2005 | Farnworth et al. |
| 6,984,889 B2 | 1/2006 | Kimura |
| 7,098,542 B1 | 8/2006 | Hoang et al. |
| 7,452,743 B2 | 11/2008 | Oliver et al. |
| 7,902,643 B2 | 3/2011 | Tuttle |
| 8,008,764 B2 | 8/2011 | Joseph et al. |
| 8,237,289 B2 | 8/2012 | Urakawa |
| 8,258,633 B2 | 9/2012 | Sezi et al. |
| 8,409,927 B1 | 4/2013 | Yim |
| 8,536,693 B2 | 9/2013 | Dungan et al. |
| 8,618,659 B2 | 12/2013 | Sato et al. |
| 8,703,542 B2 | 4/2014 | Lin et al. |
| 8,704,364 B2 | 4/2014 | Banijamali |
| 8,704,384 B2 | 4/2014 | Wu et al. |
| 8,710,648 B2 | 4/2014 | Xue |
| 8,810,006 B2 | 8/2014 | Yu et al. |
| 8,816,404 B2 | 8/2014 | Kim et al. |
| 8,872,349 B2 | 10/2014 | Chiu et al. |
| 8,912,648 B2 | 12/2014 | Lin et al. |
| 9,006,873 B2 | 4/2015 | Nikitin et al. |
| 9,018,094 B2 | 4/2015 | Kosenko et al. |
| 9,048,306 B2 | 6/2015 | Chi et al. |
| 9,136,219 B2 | 9/2015 | Iwase et al. |
| 9,184,104 B1 | 11/2015 | Chia et al. |
| 9,202,769 B2 | 12/2015 | Lin et al. |
| 9,224,669 B2 | 12/2015 | Xue |
| 9,368,563 B2 | 6/2016 | Lin et al. |
| 9,379,091 B2 | 6/2016 | England et al. |
| 9,402,312 B2 | 7/2016 | Shen et al. |
| 9,412,662 B2 | 8/2016 | Lin et al. |
| 9,704,824 B2 | 7/2017 | Lin et al. |
| 2004/0070045 A1* | 4/2004 | Suguro ............ H01L 21/28088 257/506 |
| 2007/0045798 A1* | 3/2007 | Horie ................ H01L 23/3675 257/678 |
| 2008/0237782 A1* | 10/2008 | Williams ............ H01L 21/761 257/513 |
| 2008/0244902 A1* | 10/2008 | Blackwell .......... H01L 23/4985 29/844 |
| 2009/0039523 A1* | 2/2009 | Jiang ................ H01L 21/561 257/777 |
| 2009/0072357 A1 | 3/2009 | Tang et al. |
| 2009/0102002 A1 | 4/2009 | Chia et al. |
| 2010/0176482 A1* | 7/2010 | Dennard .......... H01L 21/76254 257/506 |
| 2010/0213603 A1* | 8/2010 | Smeys .............. H01L 21/4853 257/698 |
| 2010/0225005 A1* | 9/2010 | Nishio ................ H01L 23/481 257/774 |
| 2010/0230806 A1* | 9/2010 | Huang ................ H01L 23/50 257/723 |
| 2010/0314741 A1* | 12/2010 | Lee .................... H01L 21/56 257/687 |
| 2011/0062549 A1* | 3/2011 | Lin .................... H01L 23/3128 257/531 |
| 2011/0095403 A1* | 4/2011 | Lee .................... H01L 21/4857 257/660 |
| 2011/0108943 A1* | 5/2011 | Dennard .......... H01L 21/76254 257/506 |
| 2011/0163457 A1* | 7/2011 | Mohan .............. H01L 21/4853 257/774 |
| 2012/0001339 A1* | 1/2012 | Malatkar .............. H01L 23/13 257/773 |
| 2012/0049332 A1* | 3/2012 | Chen .................... H01L 24/97 257/632 |
| 2012/0319300 A1* | 12/2012 | Kim .................... H01L 25/105 257/777 |
| 2013/0069239 A1* | 3/2013 | Kim ................ H01L 23/49827 257/774 |
| 2013/0161836 A1 | 6/2013 | Yeom et al. |
| 2013/0187292 A1* | 7/2013 | Semmelmeyer .... H01L 25/0652 257/777 |
| 2013/0217188 A1* | 8/2013 | Wang .................... H01L 21/563 438/118 |
| 2013/0249045 A1* | 9/2013 | Kang .................... H01L 23/481 257/499 |
| 2013/0249106 A1* | 9/2013 | Lin .......................... H01L 24/19 257/774 |
| 2013/0320572 A1* | 12/2013 | Chang ................ H01L 21/56 257/787 |
| 2014/0001652 A1* | 1/2014 | Chen .................... H01L 23/00 257/777 |
| 2014/0015109 A1* | 1/2014 | Lei ........................ H01L 21/78 257/618 |
| 2014/0124957 A1* | 5/2014 | Iwase .................... H01L 24/05 257/777 |
| 2014/0134804 A1* | 5/2014 | Kelly .................... H01L 23/147 438/118 |
| 2014/0225246 A1* | 8/2014 | Henderson .............. H01L 21/50 257/691 |
| 2015/0041980 A1 | 2/2015 | Ahn et al. |
| 2015/0115448 A1* | 4/2015 | Maier .................... H01L 21/306 257/751 |
| 2015/0123240 A1* | 5/2015 | Bowman .............. H01L 29/0688 257/506 |
| 2015/0228632 A1* | 8/2015 | Yu ........................ H01L 23/5384 257/704 |
| 2015/0262928 A1* | 9/2015 | Shen .................... H01L 23/315 257/676 |
| 2015/0303170 A1 | 10/2015 | Kim et al. |
| 2015/0327367 A1* | 11/2015 | Shen .................... H01L 23/5381 361/767 |
| 2016/0020193 A1* | 1/2016 | Lee ........................ H01L 28/40 257/774 |
| 2016/0042998 A1* | 2/2016 | Pueschner .............. H01L 21/302 438/114 |
| 2016/0133571 A1* | 5/2016 | Lee ........................ H01L 21/56 257/774 |
| 2016/0172302 A1* | 6/2016 | Song .................... H01L 23/5384 257/693 |
| 2016/0247761 A1* | 8/2016 | Song .................... H01L 23/5227 |
| 2016/0379885 A1* | 12/2016 | Uzoh .................... H01L 21/82 257/506 |
| 2017/0316998 A1* | 11/2017 | Marutani ............ H01L 23/3128 |

FOREIGN PATENT DOCUMENTS

| | | |
|---|---|---|
| WO | 02/34019 A1 | 4/2002 |
| WO | 2013/119309 A1 | 8/2013 |

OTHER PUBLICATIONS

International Search Report and Written Opinion for PCT Application No. PCT/US2015/030416, dated Aug. 27, 2015, 11 pages.
International Search Report and Written Opinion for PCT Application No. PCT/US2016/037430, dated Mar. 13, 2017, 15 pages.
U.S. Appl. No. 14/214,365, titled, "Integrated Circuits Protected by Substrates with Cavities, and Methods of Manufacture," filed Mar. 14, 2014, 40 pages.

* cited by examiner

STRUCTURES AND METHODS FOR RELIABLE PACKAGES

CROSS-REFERENCE TO RELATED APPLICATION(S)

This application is a divisional of, and hereby claims priority to, pending U.S. patent application Ser. No. 14/749,529, filed on Jun. 24, 2015, the entirety of which is hereby incorporated by reference herein for all purposes.

TECHNICAL FIELD

Embodiments of the present invention relate to structures of reliable packages.

DISCUSSION OF RELATED ART

Thin wafer handling in 2.5D and 3D technologies adds cost and complexity in assembly. In particular, wafer bow and cracking of thin wafers, including the interposer, can cause great difficulty during assembly. Current Chip-on-Wafer-on-Substrate (CoWoS) technologies also face challenges with wafer bow and interposer cracking during fabrication. Furthermore, thermal issues in 2.5D and 3D technologies may also lead to warpage and cracking of the components.

Therefore, there is a need for better management of the assembly of packages.

SUMMARY

In accordance with aspects of the present invention a method of forming a device includes etching one or more crack arresting cavities in a first side of a substrate device to form crack arrests, the substrate device including conductive vias formed in a substrate; mounting chip devices to the first side of the substrate device to electrically contact the vias; depositing an encapsulation layer over the chip devices and filling the crack arrests cavities; planarizing a second side to reveal the vias on the second side; and singulating through the cavities to form separated packages, with each package having one or more chip devices mounted on each singulated substrate device.

In some embodiments, a method of forming a device includes mounting a wafer to a first side of the substrate device to electrically contact with conducting vias formed in the substrate device; planarizing a second side of the substrate device to reveal the conducting vias on the second side; etching one or more cavities in the second side of the substrate; depositing an encapsulation layer on the side side of the substrate; and singulating through the cavities to form separated packages, with each package having one or more chip devices mounted on each singulated substrate device.

In some embodiments, a device can include a substrate device with conductive vias formed in a substrate, the conductive vias being exposed on a second side of the substrate; cavities formed in the substrate device; chip devices mounted to a first side of the substrate device in electrical contact with the conductive vias; and an encapsulation layer covering the chip devices and filling the cavities.

In some embodiments, a device can include a substrate device with conductive vias formed in a substrate, the conductive vias being exposed on a second side of the substrate; a wafer mounted on a first side; cavities formed in the substrate device; and an encapsulation layer covering the second side and filling the cavities.

These and other embodiments are further discussed below with respect to the following figures.

DETAILED DESCRIPTION

Figure 1:
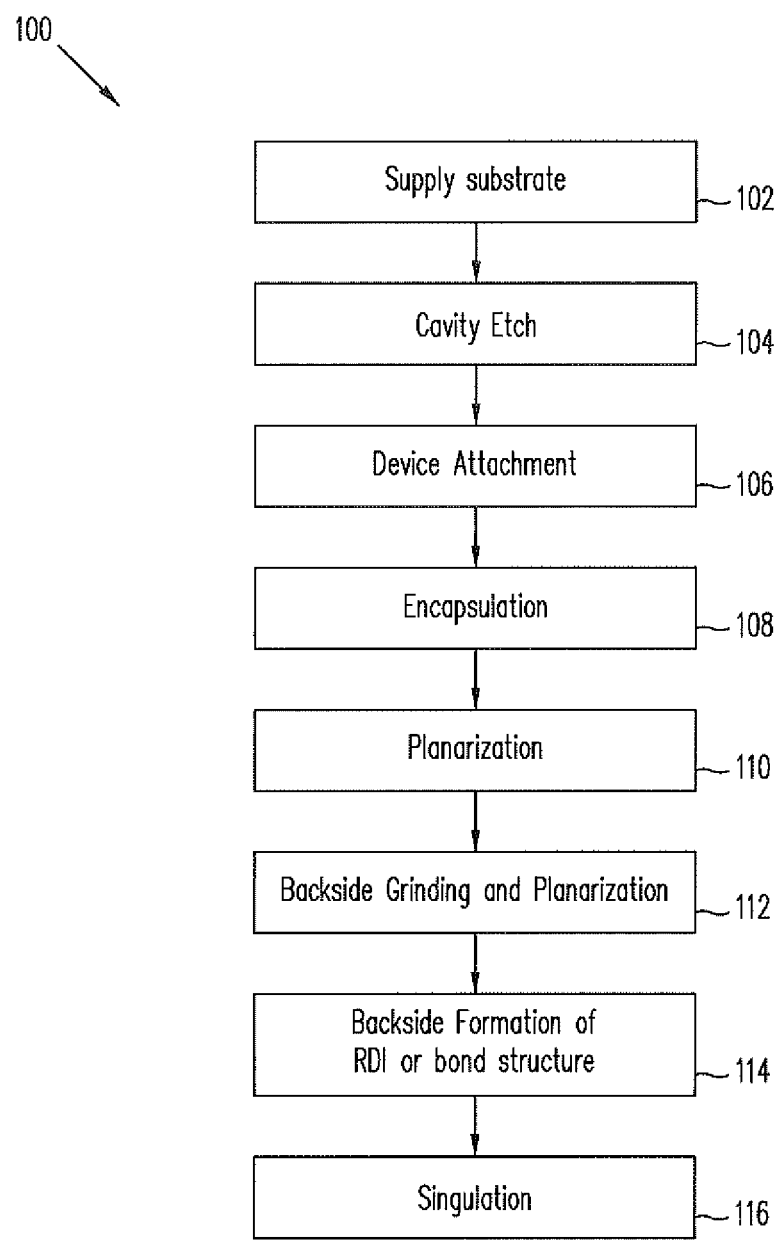
FIG. 1 illustrates a process of assembly according to some embodiments of the present invention.

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements. Further, descriptive elements such as "above" or "below" are relative to the other elements of the drawing on the drawing page and are not meant to denote absolute directionality. For example, a film described as being above a substrate may, when the substrate is turned over, actually be below the substrate. Therefore, terms such as "above" and "below" should not be interpreted as limiting but as providing only relative positioning.

Assembly according to some embodiments of the present invention can lead to encapsulation and isolation of devices throughout the assembly. In such cases, there can be little or no thin wafer handling concerns and thermal management can be enhanced. In some embodiments, crack propagation within the wafer or substrate can be arrested. Further, assembly processes according to some embodiments can be highly scalable to large devices or interposer structures.

Figure 2A:
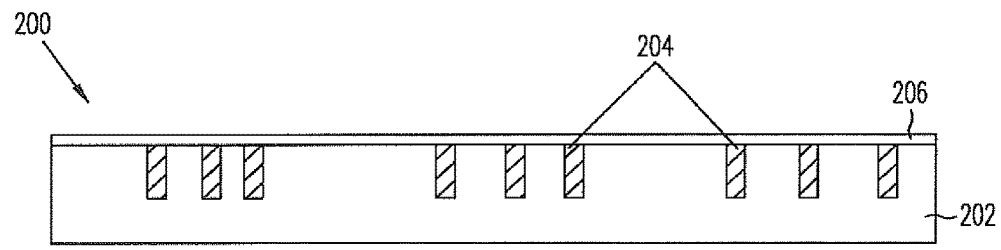
FIGS. 2A through 2M illustrate further the process of assembly illustrated in FIG. 1.

FIG. 1 illustrates a process 100 for providing a package. As shown in FIG. 1, a substrate device is supplied in step 102. As shown in FIG. 2A, substrate device 200 includes a substrate 202 with through-vias 204 formed in substrate 202. A redistribution layer (RDL) or back end-of-line layer (BEOL) 206 can be formed over substrate 202 and can be in contact with vias 204. In some embodiments, substrate 202 can be silicon or glass. Vias 204 can be through-silicon-vias (TSV)s formed with metallization materials.

Figure 2B:
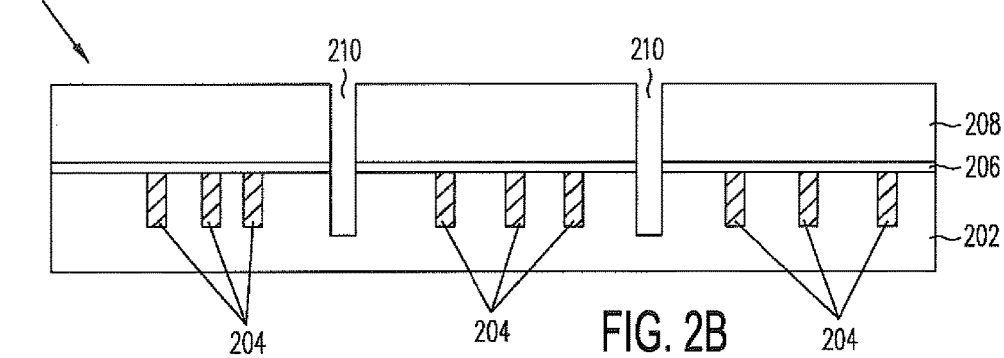

As shown in FIG. 1, a cavity etch step 104 is performed on device substrate 200. As illustrated in FIG. 2B, an etch mask 208 is formed over layer 206 and device substrate 200 is etched through mask 208 to form crack arrests 210. In some embodiments, as shown in FIG. 2B, crack arrests 210 are formed at least as deep into substrate 202 as are vias 204. In some embodiments, crack arrests 210 are etched as deeply as are vias 204. Mask 208 can then be removed from over layer 206.

Figure 2C:
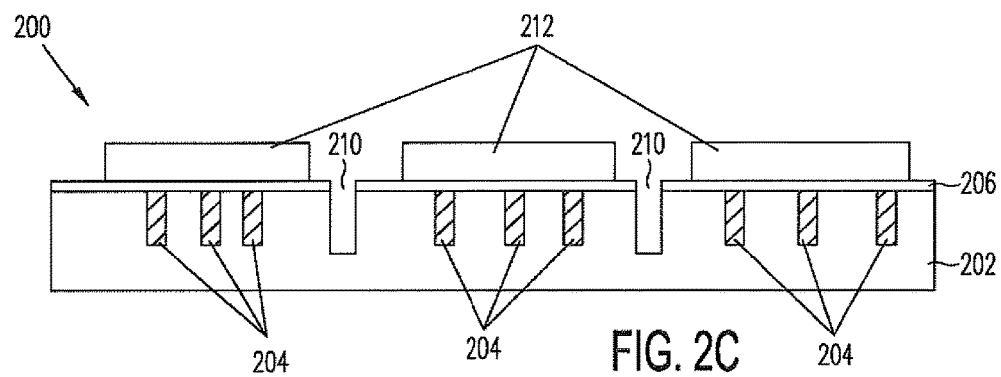
Figure 2D:
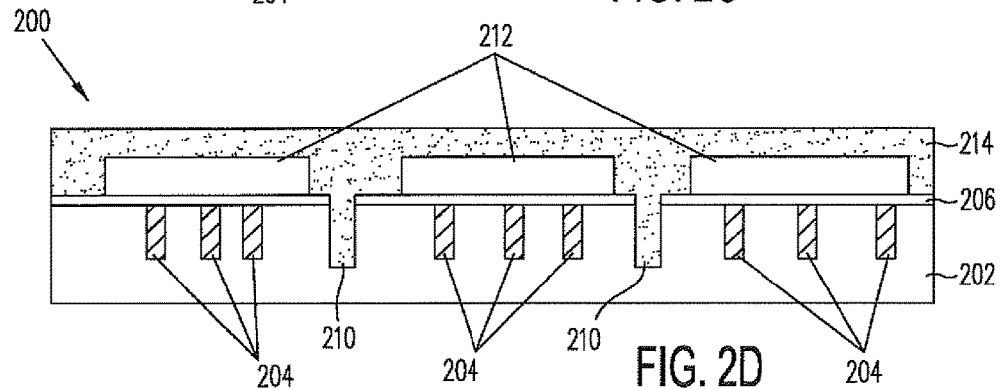
Figure 2E:
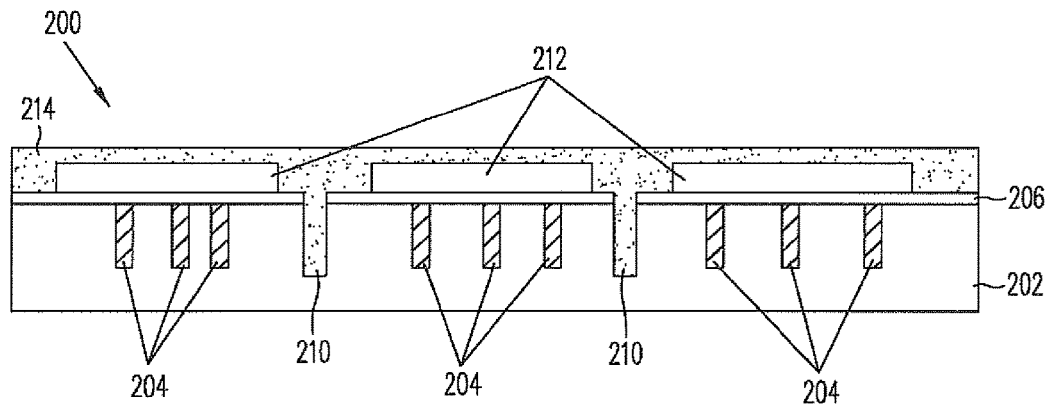

In step 106 of process 100, as illustrated in FIG. 2C, a chip device 212 is mounted over layer 206. Layer 206 provides for interconnects between chip device 212 and vias 204. In step 108, as illustrated in FIG. 2D, an encapsulation layer 214 is deposed over chip device 212 and layer 206 such that crack arrests 210 are filled and chip devices 212 are encapsulated between encapsulation layer 214 and layer 206. In step 110 of process 100, as illustrated in FIG. 2E, encapsulation layer 214 can be planarized so that its thickness is reduced. Encapsulation layer 214, however, still encapsulates chip devices 212. Encapsulation material for layer 214 can be a low coefficient of thermal expansion (CTE) dielectric material. In some embodiments, crack arrests 210 can be coated with a thin insulating layer such as TaN or TiN and encapsulation material for layer 214 can be a hard material such as aluminum oxide or other such material.

Figure 2F:
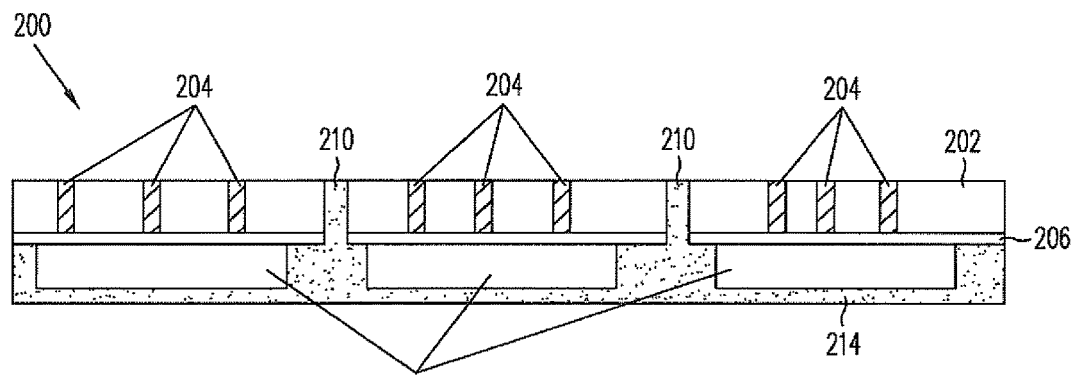

In step 112 of process 100, as illustrated in FIG. 2F, substrate 202 (the backside of substrate device 200) is ground and planarized to expose vias 204. In some embodiments, as is shown in FIG. 2F, crack arrests 210 filled with encapsulation material of layer 214 are also exposed to form isolation bridges. Embodiments where crack arrests 210 are not exposed in step 112 are discussed starting with FIG. 2J below.

Figure 2G:
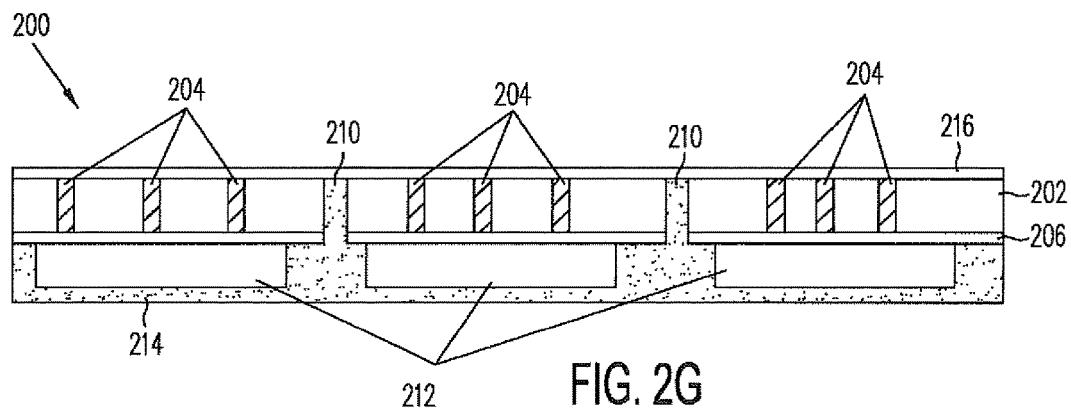

In step 114, as illustrated in FIG. 2G, an RDL layer 216 can be formed in contact with vias 204.

Figure 2H:
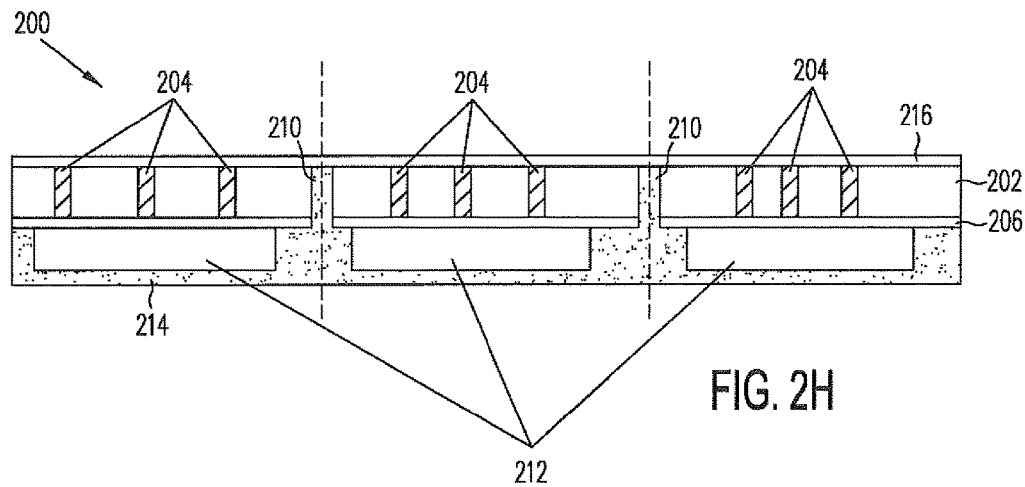
Figure 2I:
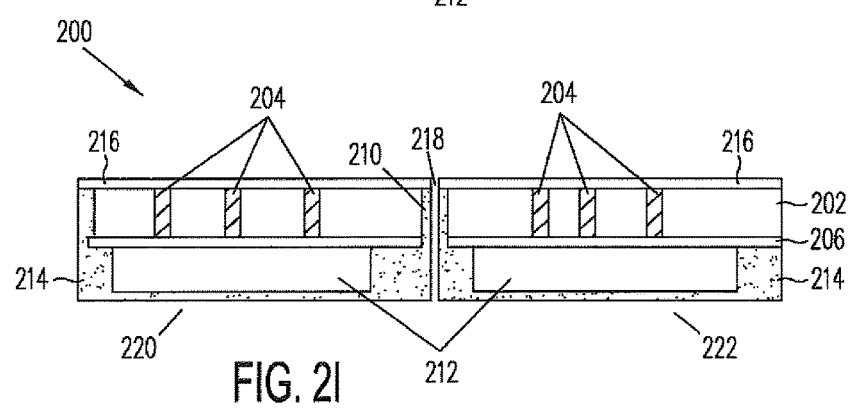
Figure 2J:
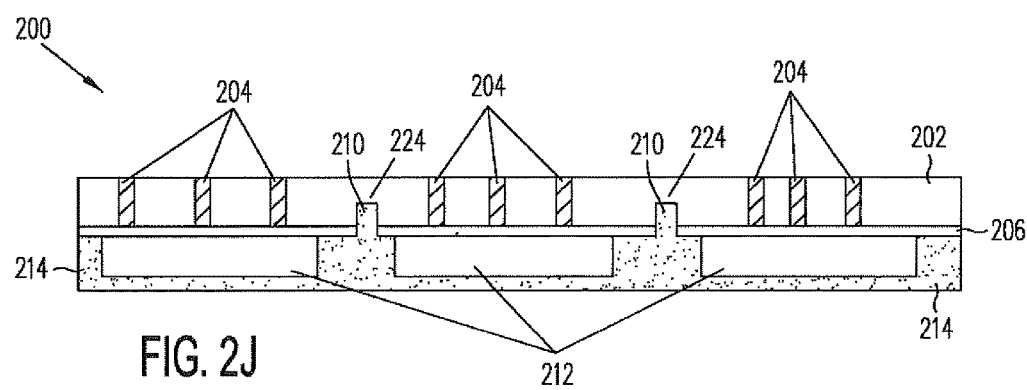

As shown in step 116 and illustrated in FIG. 2H, a singulation process is performed to split substrate device 200 along crack arrests 210. As such, as is shown in FIG. 2I, two devices 220 and 222 are separated by cut 218 through crack arrests 210. Returning to step 112 of process 100, in some embodiments crack arrests 210 are not exposed. As shown in FIG. 2J, if crack arrests 210 are not formed as deeply into substrate 202 as is vias 204, a substrate bridge 224 is formed during planarization. In such a case, crack arrests 210, filled with encapsulation material of encapsulation layer 214, are separated from the plane formed by the exposed vias 204 by a remainder of substrate material of substrate layer 202 to form the substrate bridge 224.

Figure 2K:
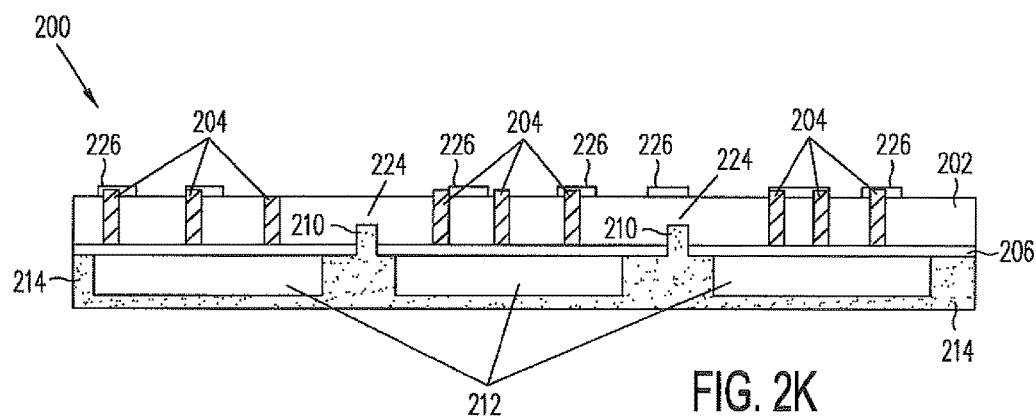
Figure 2L:
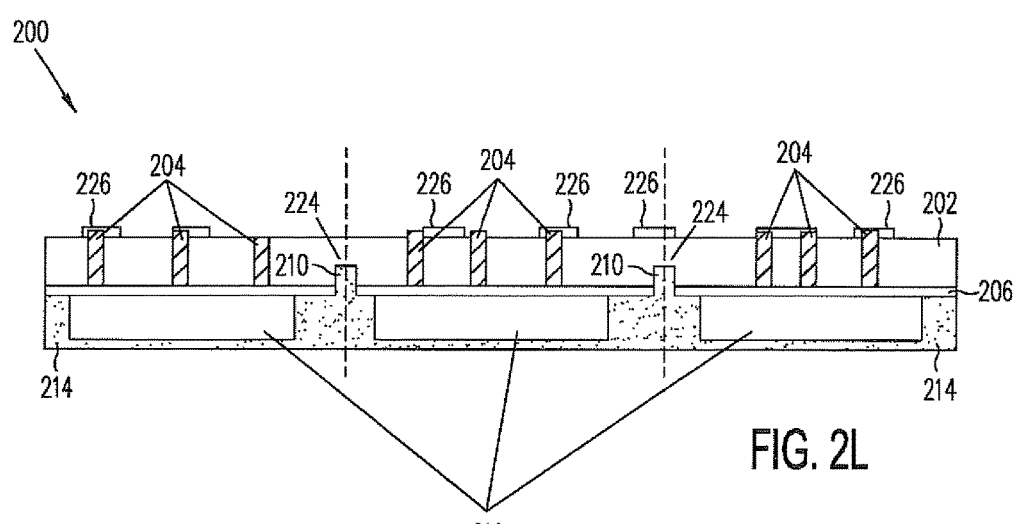
Figure 2M:
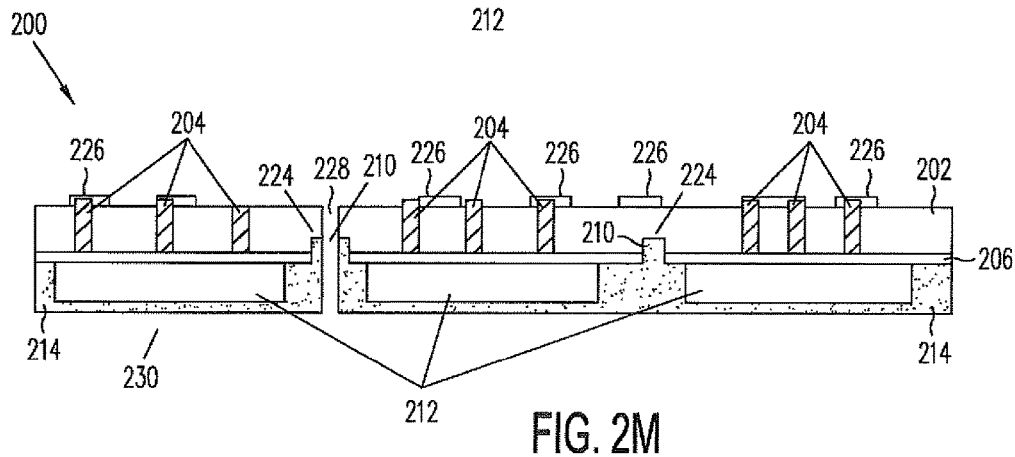

In step 114, as shown in FIG. 2K, an RDL layer or bonding layer 226 can be formed. As shown in step 116 and illustrated in FIG. 2L, a singulation process is performed to split substrate device 200 along crack arrests 210. As such, as is shown in in FIG. 2M, a device 230 is formed by a cut 228 through crack arrests 210.

Forming crack arrests 210 in device substrate 200 and then encapsulating chip devices 212 with encapsulation layer 214 protects chip devices 212 and substrate device 200 from cracking and warping throughout the assembly process. Further, such processes help to thermally manage the process so that thermal effects do not add to the warpage and cracking of the components.

Figure 3:
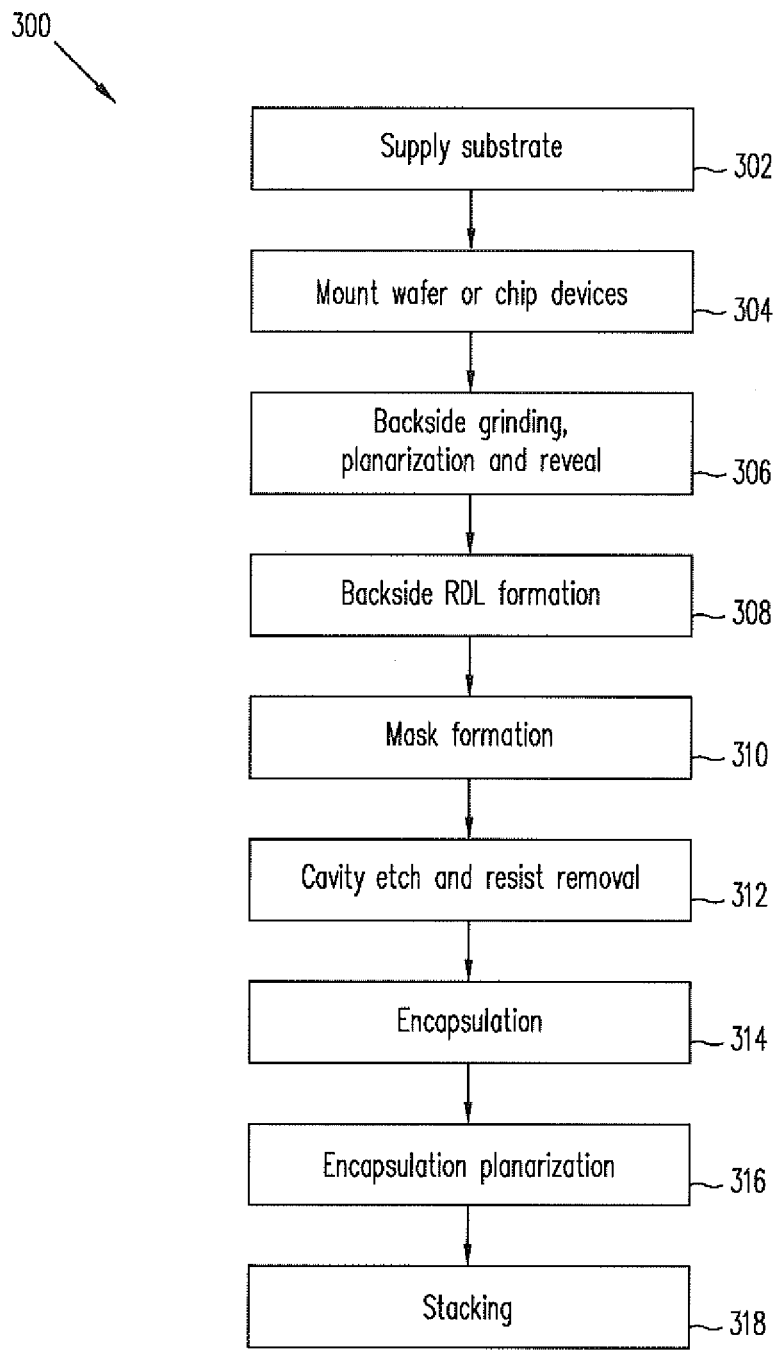
FIG. 3 illustrates a process for stacking devices according to some embodiments.
Figure 4A:
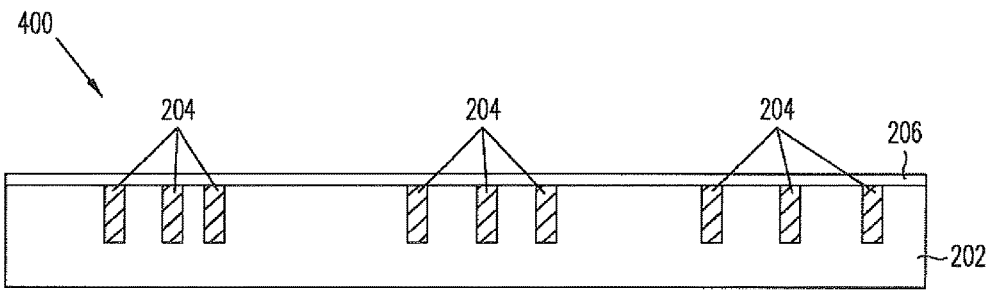
FIGS. 4A through 4I illustrate further the process of stacking illustrated in FIG. 3.

FIG. 3 illustrates a process 300 that illustrates some further aspects of embodiments of the present invention. As shown in FIG. 3, process 300 starts at step 302 with substrate device 400. As shown in FIG. 4A, substrate device 400 may be the same as substrate device 200 shown in FIG. 2A and may include a substrate 202, vias 204, and an RDL layer 206.

Figure 4B:
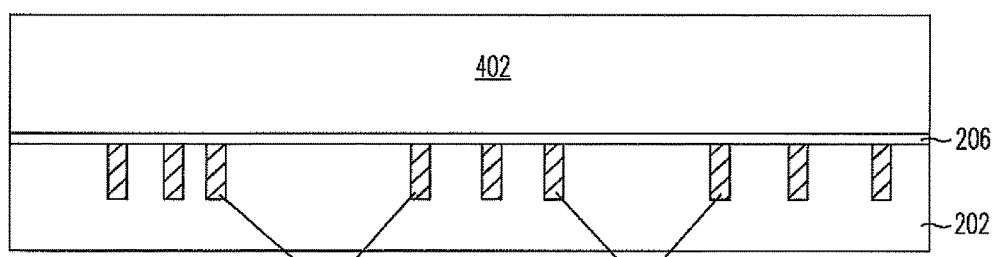

In step 304 a wafer or chip device may be mounted on RDL layer 206. FIG. 4B illustrates a wafer 402 mounted on RDL layer 206. However, one or more chip devices may be mounted as well. Wafer 402 may represent any combination of other vias and chips mounted on RDL layer 206.

Figure 4C:
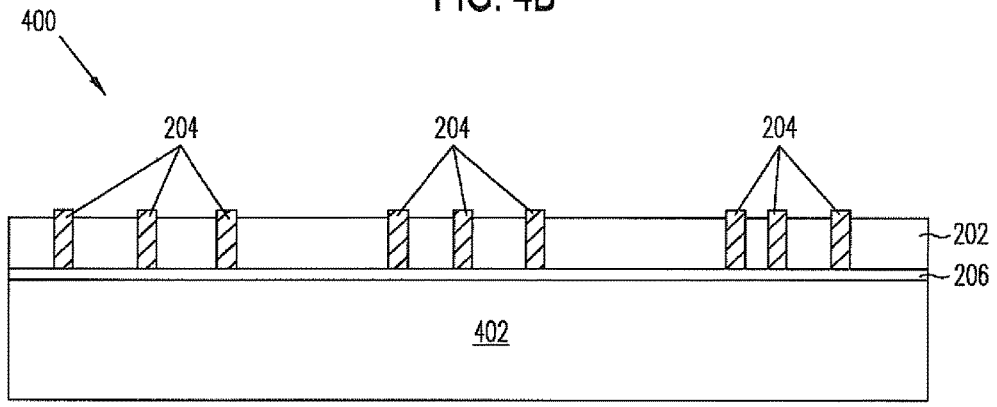
Figure 4D:
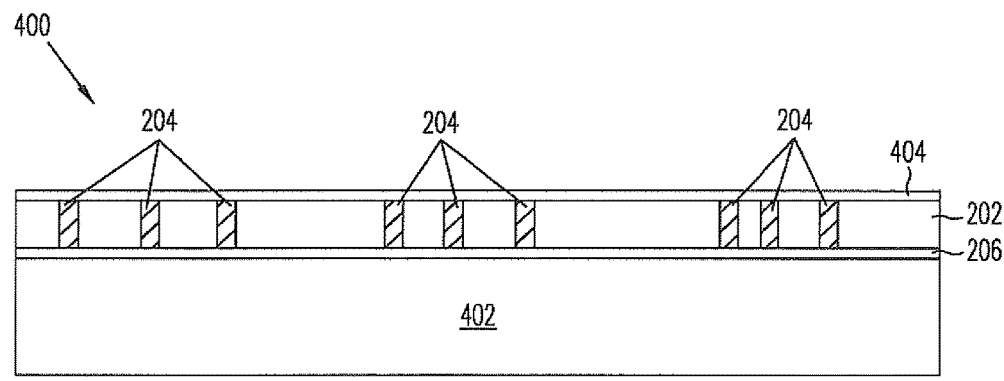

In step 306, the backside of substrate device 400 may be ground to planarize the device and reveal vias 204, as is shown in FIG. 4C. As is illustrated in FIG. 4C, substrate 202 is ground to reveal vias 204. In step 308, and as illustrated in FIG. 4D, an RDL layer 404 may be deposited in contact with the exposed vias 204. In some embodiments, RDL layer 404 may be omitted.

Figure 4E:
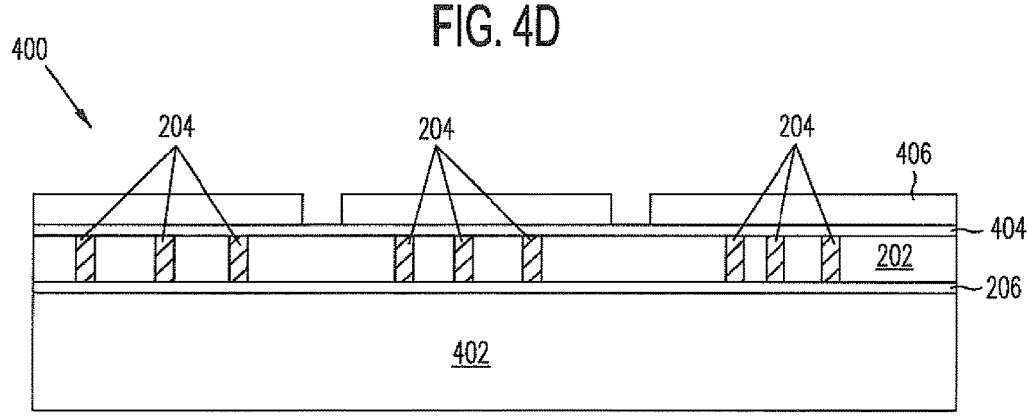
Figure 4F:
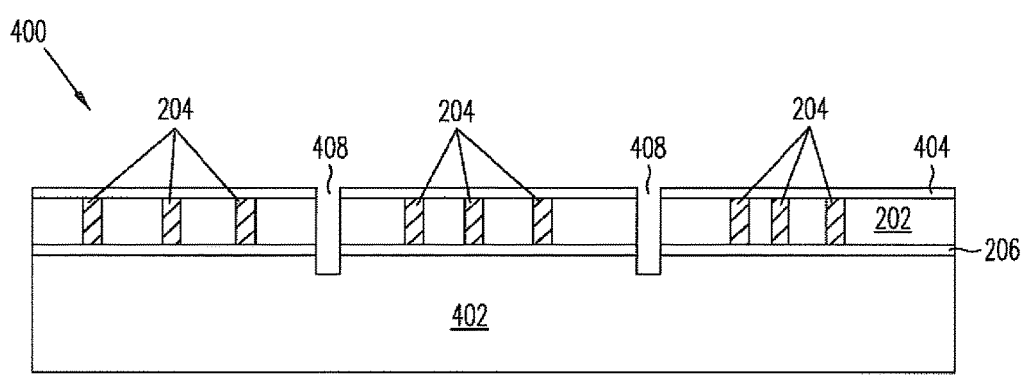
Figure 4G:
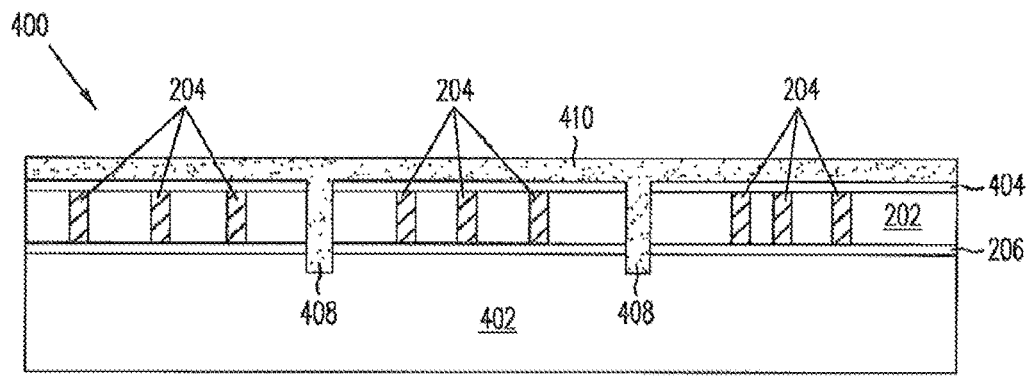

In step 310, and as shown in FIG. 4E, a mask 406 may be formed on RDL layer 404. Mask 406 may be formed by patterning a resist deposited over RDL layer 404. In step 312, and as shown in FIG. 4F, substrate device 400 is etched through mask 406 to form crack arrests 408. Mask layer 406 can then be removed. In some embodiments, chip devices (not shown) can be mounted to RDL layer 404.

In step 314, and as shown in FIG. 4Q an encapsulation layer 410 is deposited on RDL layer 404 and filling crack arrests 408. If any chip devices are mounted on RDL layer 404, then encapsulation layer 410 can encapsulated the mounted chip devices.

Figure 4H:
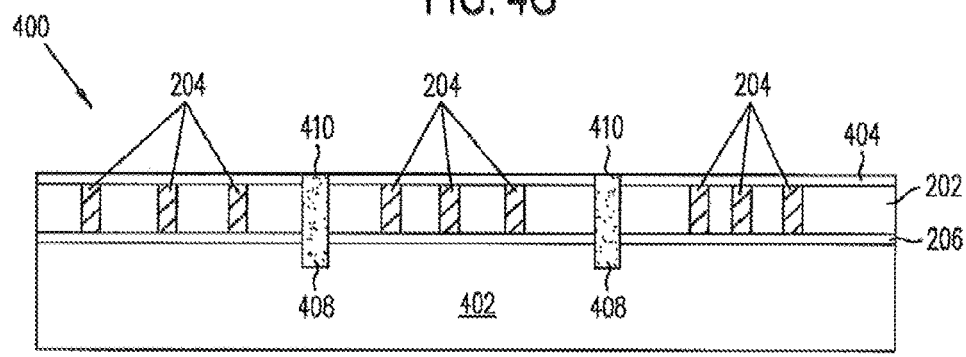
Figure 4I:
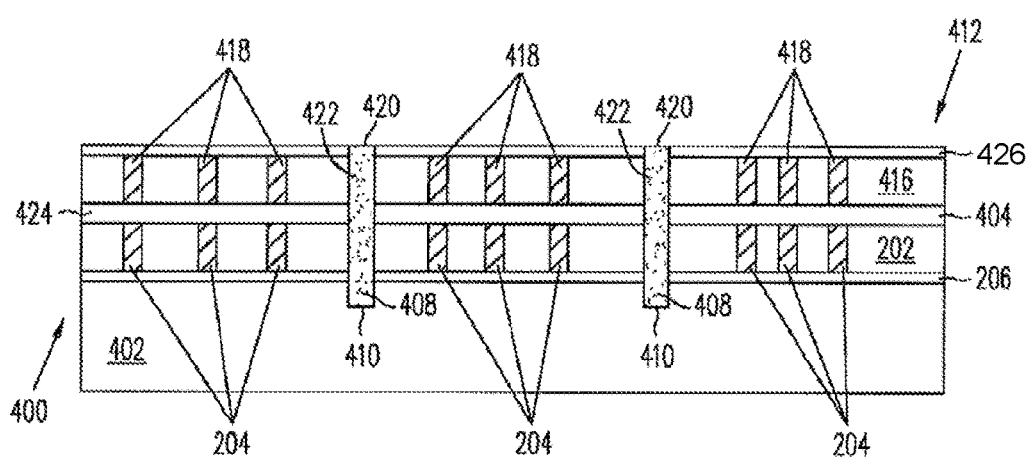

In step 316, and as illustrated in FIG. 4H, the encapsulation layer 410 can be removed to RDL layer 404, or if any chip devices are mounted on RDL layer 404 to the chip devices, or if RDL layer 404 is absent to expose vias 204. In step 318, as shown in FIG. 4I another substrate device 412 can be stacked with substrate device 400. As shown in FIG. 4I, substrate device 412 can include a substrate 416 with RDL layers 426 and 424 and with vias 418 formed between RDL layers 426 and 424. Further, crack arrests 420 filled with encapsulation material 422 are formed. Substrate device 412 is mounted to substrate device 400 such that RDL layer 424 contacts RDL layer 404. As such, substrate device 412 can be formed similarly to substrate device 400 except that wafer 402 is absent.

As shown in process 300, in some embodiments multiple layers can be stacked and backside etching can be performed. It should be noted that aspects of process 300 can be included in process 100 in order to stack multiple components. Further, the stacked combination of substrate device 412 with substrate device 400 can be separated by cutting through crack arrests 420 and crack arrest 410.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A packaged device, comprising:
    a substrate device with conductive vias formed in a substrate, the conductive vias extending between a first side and a second side of the substrate;
    cavities formed in the substrate with the conductive vias between the cavities;
    chip devices mounted at least proximate to the first side of the substrate device for electrical conductivity with the conductive vias, each of the chip devices external to the substrate and to the cavities formed in the substrate such that the cavities in the substrate are located around a perimeter of a chip device of the chip devices; and
    an encapsulation layer covering upper and side surfaces of the chip devices and extending into the cavities.

2. The packaged device of claim 1, wherein the substrate device further includes a redistribution layer in contact with the conductive vias on the first side of the substrate, the redistribution layer interconnecting the chip devices mounted thereon for electrical conductivity with the conductive vias, the cavities extending through the redistribution layer, and the encapsulation layer in contact with a surface of the redistribution layer.

3. The packaged device of claim 2, wherein the cavities extend to the second side of the substrate to provide isolation between the chip devices and corresponding portions of the substrate and the redistribution layer.

4. The packaged device of claim 1, wherein the cavities extend from the first side of the substrate toward the second side of the substrate leaving sections of the substrate in place forming corresponding substrate bridges proximate to the second side of the substrate prior to singulation through the cavities.

5. The packaged device of claim 1, wherein the substrate device further includes a back-end-of-line layer or a bonding layer on the second side of the substrate.

6. A packaged device, comprising:
a substrate device with conductive vias formed in a substrate, the conductive vias extending between a first side and a second side of the substrate;
a wafer mounted at least proximate to the first side of the substrate;
cavities formed in the substrate with the conductive vias between the cavities;
the cavities extending through the substrate from the second side to the first side thereof and into the wafer;
chip devices of the wafer each of which being external to the substrate and to the cavities formed in the substrate such that the cavities in the substrate are located along perimeters of the chip devices of the wafer; and
an encapsulation layer above the second side of the substrate and in the cavities.

7. The packaged device of claim 6, wherein the substrate device further includes a redistribution layer in contact with the conductive vias on the second side of the substrate, the cavities extending through the redistribution layer, and the encapsulation layer is in contact with a surface of the redistribution layer and in the cavities.

8. The packaged device of claim 7, further comprising chip devices mounted on the redistribution layer, the redistribution layer interconnecting the chip devices mounted thereon for electrical conductivity with the conductive vias.

9. The packaged device of claim 7, wherein the substrate device, the conductive vias, and the cavities respectively are a first substrate device, first conductive vias, and first cavities, the packaged device further comprising a second substrate device having second conductive vias extending through a second substrate and having second cavities in the second substrate, the second substrate mounted on the redistribution layer for interconnection with the second conductive vias and for alignment of the first cavities and the second cavities with one another.

10. The packaged device of claim 7, wherein the redistribution layer is a first redistribution layer, the packaged device further comprising a second redistribution layer on the first side of the substrate, the wafer mounted on the second redistribution layer, wherein the cavities extend through the first redistribution layer, the substrate, and the second redistribution layer, and further extend into the wafer, and wherein the encapsulation layer is in contact with a surface of the second redistribution layer.

11. The packaged device of claim 1, further comprising a bonding layer on the second side of the substrate.

12. The packaged device of claim 1, further comprising a redistribution layer on the second side of the substrate.

13. The packaged device of claim 12, wherein the redistribution layer on the second side of the substrate is in contact with the conductive vias.

14. The packaged device of claim 6, further comprising a bonding layer on the second side of the substrate.

15. The packaged device of claim 6, further comprising a redistribution layer on the second side of the substrate.

16. The packaged device of claim 15, wherein the redistribution layer on the second side of the substrate is in contact with the conductive vias.

17. The packaged device of claim 1, wherein the cavities are crack arrestors.

18. The packaged device of claim 6, wherein the cavities are crack arrestors.

19. The packaged device of claim 6, wherein the substrate device is a first substrate device having first conductive vias formed in a first substrate, the packaged device further comprising:
a second substrate device coupled to the first substrate device;
the second substrate device with second conductive vias formed in a second substrate, the second conductive vias extending between a first side and a second side of the second substrate;
the cavities formed in the second substrate with the second conductive vias between the cavities;
the cavities extending through the second substrate from the second side to the first side thereof to and through the first substrate; and
wherein the encapsulation layer is above the second side of the second substrate and in the cavities.

20. The packaged device of claim 19, wherein the first substrate device is coupled to the second substrate device with a redistribution layer.

* * * * *